(12) United States Patent
Kim et al.

(10) Patent No.: US 9,184,156 B2
(45) Date of Patent: Nov. 10, 2015

(54) SEMICONDUCTOR PACKAGES AND ELECTRONIC SYSTEMS INCLUDING THE SAME

(71) Applicant: SAMSUNG ELECTRONICS CO., LTD., Suwon-si, Gyeonggi-do (KR)

(72) Inventors: Hye-Jin Kim, Suwon-si (KR); Byung-seo Kim, Suwon-si (KR); Sun-Pil Youn, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/491,302

(22) Filed: Sep. 19, 2014

(65) Prior Publication Data

US 2015/0001737 A1  Jan. 1, 2015

Related U.S. Application Data

(63) Continuation of application No. 14/170,972, filed on Feb. 3, 2014, now Pat. No. 8,901,749, which is a continuation of application No. 13/630,619, filed on Sep. 28, 2012, now Pat. No. 8,643,193, which is a continuation of application No. 12/659,775, filed on Mar. 22, 2010, now Pat. No. 8,299,627.

(30) Foreign Application Priority Data

Apr. 27, 2009 (KR) .................. 10-2009-0036731

(51) Int. Cl.
*H01L 23/52* (2006.01)
*H01L 25/065* (2006.01)
*H01L 23/00* (2006.01)
*H01L 25/18* (2006.01)

(52) U.S. Cl.
CPC ............ *H01L 25/0657* (2013.01); *H01L 24/49* (2013.01); *H01L 25/18* (2013.01); *H01L 2224/48091* (2013.01); *H01L 2224/48145* (2013.01); *H01L 2224/4911* (2013.01); *H01L 2225/06506* (2013.01); *H01L 2225/06527* (2013.01); *H01L 2225/06562* (2013.01); *H01L 2924/014* (2013.01); *H01L 2924/01033* (2013.01); *H01L 2924/01047* (2013.01); *H01L 2924/15311* (2013.01)

(58) Field of Classification Search
USPC .................. 257/686, 777, E25.006, E25.021, 257/E25.27, E23.085
See application file for complete search history.

(56) References Cited

U.S. PATENT DOCUMENTS

| | | | |
|---|---|---|---|
| 7,026,718 B1 | 4/2006 | Chan et al. | |
| 7,352,067 B2 | 4/2008 | Fukaishi et al. | |
| 7,642,632 B2 | 1/2010 | Kang | |
| 7,732,930 B2 | 6/2010 | Makino et al. | |
| 8,232,654 B2 | 7/2012 | Suh | |
| 8,324,725 B2 * | 12/2012 | Khandros et al. | 257/723 |
| 2006/0286822 A1 * | 12/2006 | Thomas et al. | 439/55 |

* cited by examiner

*Primary Examiner* — Jasmine Clark
(74) *Attorney, Agent, or Firm* — F. Chau & Associates, LLC

(57) ABSTRACT

A plurality of semiconductor chips may be stacked on the substrate, and each of them may include at least one electrode pad. At least one of the plurality of semiconductor chips may include at least one redistribution pad configured to electrically connect with the at least one electrode pad.

20 Claims, 4 Drawing Sheets

SEMICONDUCTOR PACKAGES AND ELECTRONIC SYSTEMS INCLUDING THE SAME

CROSS-REFERENCE TO RELATED APPLICATIONS

This application is a continuation of U.S. application Ser. No. 14/170,972, filed Feb. 3, 2014, now U.S. Pat. No. 8,901,749, issued Dec. 2, 2014 which is a continuation of U.S. application Ser. No. 13/630,619, filed Sep. 28, 2012, now U.S. Pat. No. 8,643,193, issued Feb. 4, 2014, which is a continuation of U.S. application Ser. No. 12/659,775, filed Mar. 22, 2010, now U.S. Pat. No. 8,299,627, issued Oct. 30, 2012, which claims priority under 35 U.S.C. §119 to Korean Application No. 10-2009-0036731, filed Apr. 27, 2009 in the Korean Intellectual Property Office (KIPO), the entire contents of each of which are hereby incorporated herein by reference.

BACKGROUND

1. Field

Example embodiments relate to semiconductor devices and electronic systems including the same, and more particularly, to a semiconductor packages having a plurality of semiconductor chips mounted therein and electronic systems including the same.

2. Description of the Related Art

Semiconductor products require processing of high-volume data in spite of a decrease in their volume. As a result, highly integrated semiconductor chips implemented in the semiconductor chips as a single package may be necessary. However, higher integration of the semiconductor chips may be difficult to achieve due to the limitation of integration technologies and may be more expensive. In this context, a semiconductor package of a multi-chip type in which a plurality of semiconductor chips are implemented in a single package is under consideration.

SUMMARY

According to example embodiments, there is provided a semiconductor package. A substrate may be provided A plurality of semiconductor chips may be deposited on the substrate, and each of them may include at least one electrode pad. At least one of the plurality of semiconductor chips may include at least one redistribution pad configured to electrically connect with the at least one electrode pad.

In example embodiments of the semiconductor package, the at least one of the plurality of semiconductor chips may further include at least one redistribution line configured to connect the at least one electrode pad with the at least one redistribution pad.

In example embodiments of the semiconductor package, the at least one redistribution pad and the at least one electrode pad of the at least one of the plurality of semiconductor chips may be disposed along different edges on the same surface of the at least one of the plurality of semiconductor chips.

In example embodiments of the semiconductor package, the plurality of semiconductor chips may further include a upper semiconductor chip on the at least one of the plurality of semiconductor chips, and at least one electrode pad of the upper semiconductor chip may be adjacent to the at least one redistribution pad.

In example embodiments of the semiconductor package, the plurality of semiconductor chips may be stacked in offset directions from one another. The at least one redistribution pad and the at least one electrode pad of the at least one of the plurality of semiconductor chips may be exposed.

According to example embodiments, there is provided a semiconductor package. A substrate is provided. A plurality of first semiconductor chips may be on a first portion of the substrate and each of them may include at least one electrode pad. A second semiconductor chip may be deposited on a second portion of the substrate, which is different from the first portion. At least one of the plurality of first semiconductor chips may include at least one redistribution pad configured to electrically connect with the at least one electrode pad.

In example embodiments, the at least one of the plurality of first semiconductor chips may include at least one redistribution line configured to connect the at least one electrode pad with the at least one redistribution pad. The at least one redistribution pad and the at least one electrode pad of the at least one of the plurality of first semiconductor chips may be disposed along different edges on the same surface of the at least one of the plurality of first semiconductor chips.

In example embodiments, the plurality of first semiconductor chips may further include an upper semiconductor chip stacked directly on the at least one of the plurality of first semiconductor chips, and at least one electrode pad of the upper semiconductor chip adjacent to the at least one redistribution pad. The plurality of first semiconductor chips may be stacked in offset directions from one another. The at least one redistribution pad and the at least one electrode pad of the at least one of the plurality of first semiconductor chips are exposed. The at least one redistribution pad of the at least one of the plurality of first semiconductor chips may be exposed, and the at least one electrode pad of the at least one of the plurality of first semiconductor chips may be covered with other semiconductor chips.

In example embodiments, the semiconductor package may further include a plurality of bonding wires configured to connect the plurality of semiconductor chips, wherein at least one of the plurality of bonding wires may be connected with the at least one of the plurality of first semiconductor chips through the at least one redistribution pad.

According to example embodiments, there is provided an electronic system. An input/output unit may be provided to communicate data with an external device. A memory unit may be provided to store the data. A processor unit may be provided to execute the data. The memory unit may include any one of the above-described semiconductor packages. The processor unit, the input/output unit, and the memory unit may communicate data therebetween via a bus.

BRIEF DESCRIPTION OF THE DRAWINGS

Example embodiments will be more clearly understood from the following detailed description taken in conjunction with the accompanying drawings in which.

DETAILED DESCRIPTION OF EXAMPLE EMBODIMENTS

Figure 1:
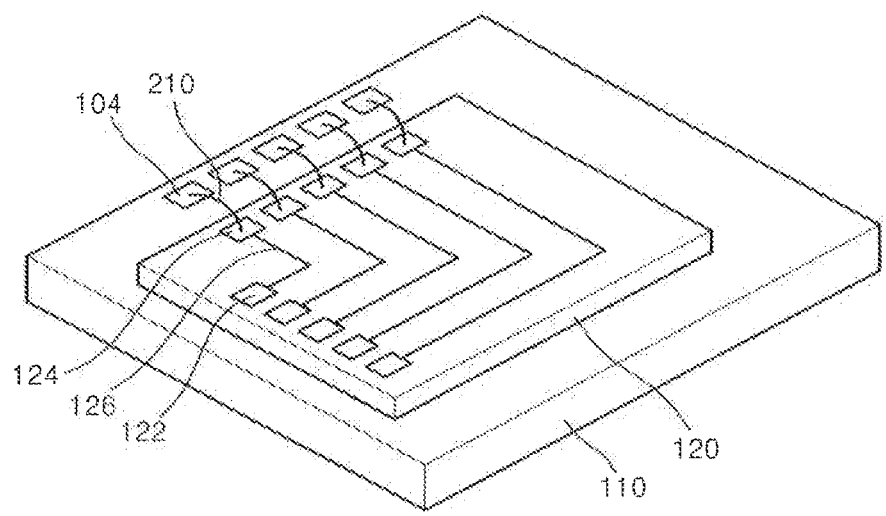
FIGS. 1-5 are perspective views illustrating semiconductor packages according to example embodiments.

Hereinafter, the inventive concept will be described in detail by describing example embodiments with reference to the accompanying drawings. However, the inventive concept is not limited by example embodiments to be disclosed below and may be implemented in various forms. Example embodiments are only provided to make the disclosure of the inventive concept complete and make those of ordinary skill in the art fully know the scope of the inventive concept. In the drawings, the sizes of elements may be exaggerated for convenience of illustration.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is perspective view illustrating a semiconductor package according to example embodiments. Referring to FIG. 1, a substrate 110 may be provided. For example, the substrate 110 may include various types of substrates, e.g., a printed circuit board (PCB), a flexible substrate, and/or a tape substrate. The substrate 110 may include bonding fingers 404 on a top surface thereof. The bonding fingers 104 may be connected to a bottom surface of the substrate 110 through an internal circuit of the substrate 110. For example, the substrate 110 may further include bonding pads (102 of FIG. 6) and external terminals (115 of FIG. 6) on the bottom surface thereof. The external terminals (115 of FIG. 6) may be disposed on the bonding pads (102 of FIG. 6) and the bonding fingers 104 may be electrically connected to the bonding pads (102 of FIG. 6). The number and arrangement of the bonding fingers 104 are illustrated and may be properly selected according to the type and usage of the semiconductor package.

A first semiconductor chip 120 may be stacked on the substrate 110. For example, the first semiconductor chip 120 may be attached on the substrate 110 by using an adhesive member (not shown). The first semiconductor chip 120 may be a memory chip or a logic chip. The memory chip may include various types of memories, e.g., a dynamic random access memory (DRAM), a static random access memory (SRAM), a flash memory, a programmable random access memory (PRAM), a resistive random access memory (ReRAM), ferroelectric random access memory (FeRAM), or a magnetoresistive random access memory (MRAM).

The first semiconductor chip 120 may include first electrode pads 122 and first redistribution pads 124 on a top surface thereof. The first electrode pads 122 may be connected to the internal circuit of the first semiconductor chip 120. The first redistribution pads 124 may be connected with the first electrode pads 122 by using first redistribution lines 126 and may serve to move the positions of the first electrode pads 122. For example, the first electrode pads 122 and the first redistribution pads 124 may be disposed along different edges on the same surface of the first semiconductor chip 120. The number of first electrode pads 122 and the number of first redistribution pads 124 are illustrated and may be properly selected according to the type of the first semiconductor chip 120.

The first semiconductor chip 120 may be stacked in an offset direction from an edge of the substrate 110 such that the bonding fingers 104 are exposed. The first semiconductor chip 120 may be disposed on the substrate 110 such that the first redistribution pads 124 are disposed on the same surface as the bonding fingers 104. For example, the first redistribution pads 124 may be disposed adjacent to the bonding fingers 104. Thus, even when the bonding fingers 104 and the first electrode pads 122 are not adjacent to each other, the first redistribution pads 124 may be adjacent to and in the same direction as the bonding fingers 104 through the first redistribution lines 126 without a need to rotate the first semiconductor chip 120.

First bonding wires 210 may connect the bonding fingers 104 with the first redistribution pads 124, whereby the substrate 110 and the first semiconductor chip 120 may be electrically connected with each other. Because the bonding fingers 104 and the first redistribution pads 124 are offset adjacent to and in the same direction as each other, connections of the first bonding wires 210 may be simplified. Thus, the probability of a problem, e.g., loop failure or short-circuit of the first bonding wires 210, occurring may be lowered.

Figure 2:
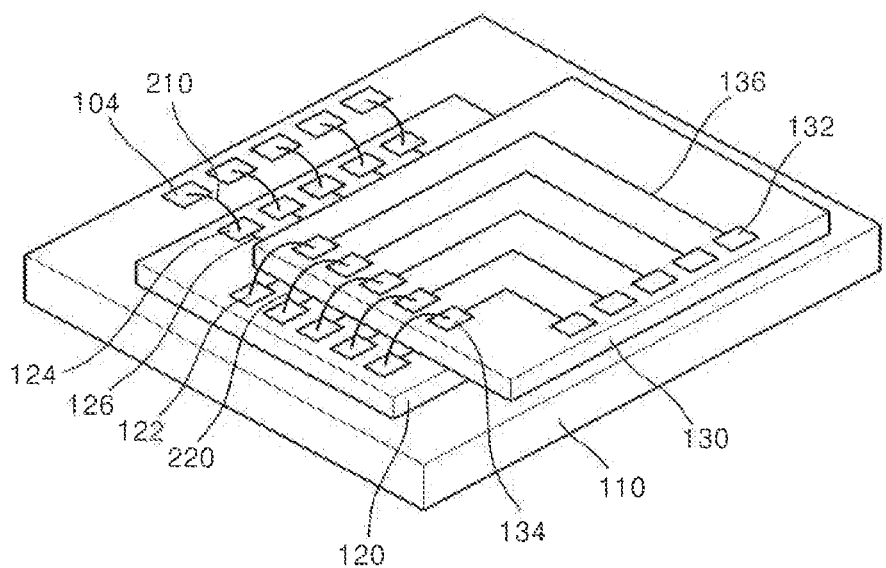

FIG. 2 is a perspective view illustrating a semiconductor package according to example embodiments. The semiconductor package according to example embodiments illustrated in FIG. 2 uses the semiconductor package illustrated in FIG. 1, and thus a repetitive description thereof will be omitted.

Referring to FIG. 2, a second semiconductor chip 130 may be further stacked on the first semiconductor chip 120. The second semiconductor chip 130 may include second electrode, pads 132 and second redistribution pads 134. The second electrode pads 132 may be connected to an internal circuit of the second semiconductor chip 130. The second redistribution pads 134 may be connected with the second electrode pads 132 by using second redistribution lines 136, and may serve to move the positions of the second electrode pads 132. For example, the second electrode pads 132 and the second redistribution pads 134 may be disposed along different edges on the same surface of the second semiconductor chip 130. The number of second electrode pads 132 and the number of second redistribution pads 134 are illustrated and may be properly selected according to the type of the second semiconductor chip 130.

The second redistribution pads 134 of the second semiconductor chip 130 may be disposed adjacent to the first electrode pads 122 of the first semiconductor chip 120. For example, the second redistribution pads 134 may be disposed in the same direction as the first electrode pads 122. The second bonding wires 220 may connect the second redistribution pads 134 with the first electrode pads 122, whereby the first and second semiconductor chips 120 and 130 may be electrically connected with each other. Because the first semiconductor chip 120 is electrically connected with the substrate 110, the first and second semiconductor chips 120 and 130 may be electrically connected with the substrate 110.

For connections of the first bonding wires 210, the first semiconductor chip 120 may be offset in a direction inward from an edge of the substrate 110 where the bonding fingers 104 are disposed such that the bonding fingers 104 of the substrate 110 are exposed, and the second semiconductor chip 130 may be offset in a direction inward from an edge of the first semiconductor chip 120 such that the first redistribution pads 124 of the first semiconductor chip 120 are exposed. For the connections of the first bonding wires 210, the second semiconductor chip 130 may be offset in a direction inward from the edge of the first semiconductor chip 120 where the first redistribution pads 124 are disposed, such that the first redistribution pads 124 of the first semiconductor chip 120 may be exposed. For example, the second semiconductor chip 130 may be offset in two orthogonal axial directions from the edges of the first semiconductor chip 120.

According to example embodiments, the first and second semiconductor chips 120 and 130 may be connected by the second bonding wires 220 in offset directions from one another and the first and second redistribution pads 124 and 134 without complicatedly rotating the first and second semiconductor chips 120 and 130, and the first semiconductor chip 120 and the substrate 110 may be connected with each other through the first bonding wires 210. As a result, the lengths of the connections of the first and second bonding wires 210 and 220 may be reduced and the arrangements of the connections of the first and second bonding wires 210 and 220 may be simplified. Subsequently, the height of loops of the first and second bonding wires 210 and 220 can be easily controlled and the occurrence of a crack in the first and second semiconductor chips 120 and 130 due to overhang of the first and second bonding wires 210 and 220 may be prevented or reduced.

In example embodiments, the number of first and second semiconductor chips 120 and 130 may be illustrated. Therefore, one semiconductor chip or a plurality of semiconductor chips (not shown) may be further stacked on the second semiconductor chip 130.

Figure 3:
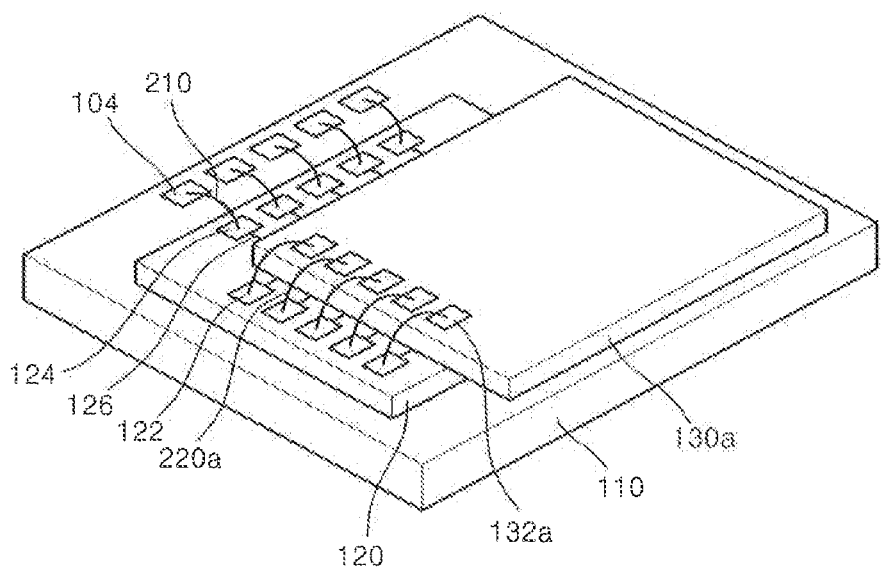

FIG. 3 is a perspective view illustrating a semiconductor package according to example embodiments. The semiconductor package according to example embodiments as illustrated in FIG. 3 is a modification of the semiconductor package illustrated in FIG. 2 in which some components are changed, and thus a repetitive description thereof will be omitted.

Referring to FIG. 3, a third semiconductor chip 130a may include third electrode pads 132a adjacent to the first electrode pads 122 of the first semiconductor chip 120. Thus, the first and third semiconductor chips 120 and 130a may be electrically connected with each other by connecting the first and third electrode pads 122 and 132a with third bonding wires 220a. In example embodiments, the third semiconductor chip 130a may not include any redistribution pad. One or more second semiconductor chips 130 illustrated in FIG. 2 may be stacked on the third semiconductor chip 130a.

Figure 4:
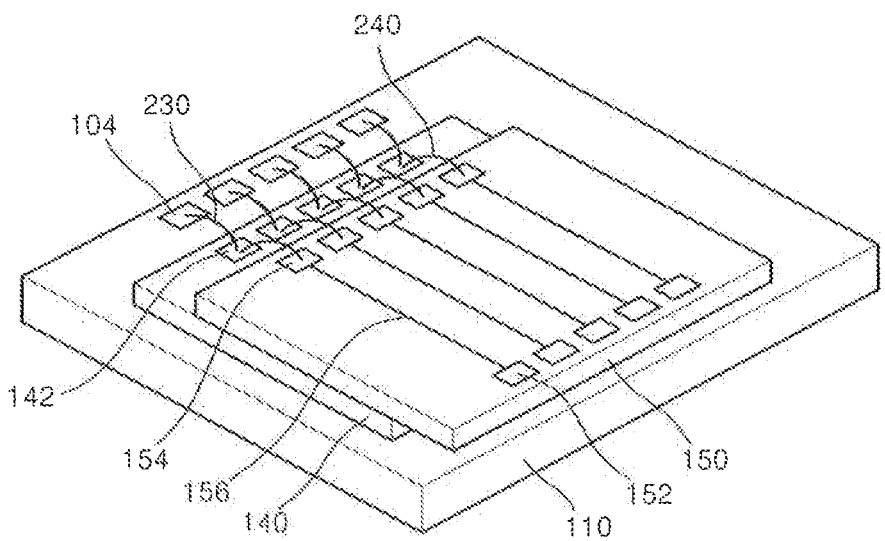

FIG. 4 is a perspective view illustrating a semiconductor package according to example embodiments. Referring to FIG. 4, fourth and fifth semiconductor chips 140 and 150 may be stacked on one another on the substrate 110. The substrate 110 may be the same as the substrate 110 of FIG. 1. The fourth semiconductor chip 140 may include fourth electrode pads 142. The fourth electrode pads 142 may be adjacent to the bonding fingers 104 of the substrate 110. The fifth semiconductor chip 150 may include fifth electrode pads 152 and third redistribution pads 154. The third redistribution pads 154 may be adjacent to the fourth electrode pads 142 of the fourth semiconductor chip 140 and may be connected to the fifth electrode pads 152 by using third redistribution lines 156.

In example embodiments, the bonding fingers 104 of the substrate 110, the fourth electrode pads 142 of the fourth semiconductor chip 140, and the third redistribution pads 154 of the fifth semiconductor chip 150 may be adjacent to and in the same direction as one another. Thus, the fourth and fifth semiconductor chips 140 and 150 may be offset in one direction sequentially from the edge of the substrate 110 where the bonding fingers 104 are disposed. Fourth bonding wires 230 may connect the bonding fingers 104 with the fourth electrode pads 142, and fifth bonding wires 240 may connect the fourth electrode pads 142 with the third redistribution pads 154, whereby the fourth and fifth semiconductor chips 140 and 150 may be electrically connected with the substrate 110.

In example embodiments, the fourth semiconductor chip 140 may be the same structure as the fifth semiconductor chip 150. In example embodiments, the positions of the fourth electrode pads 142 may be moved to positions that are similar to those of the fifth electrode pads 152, and thus, the fourth electrode pads 142 may not be exposed because of being covered with the fifth semiconductor chip 150.

Figure 5:
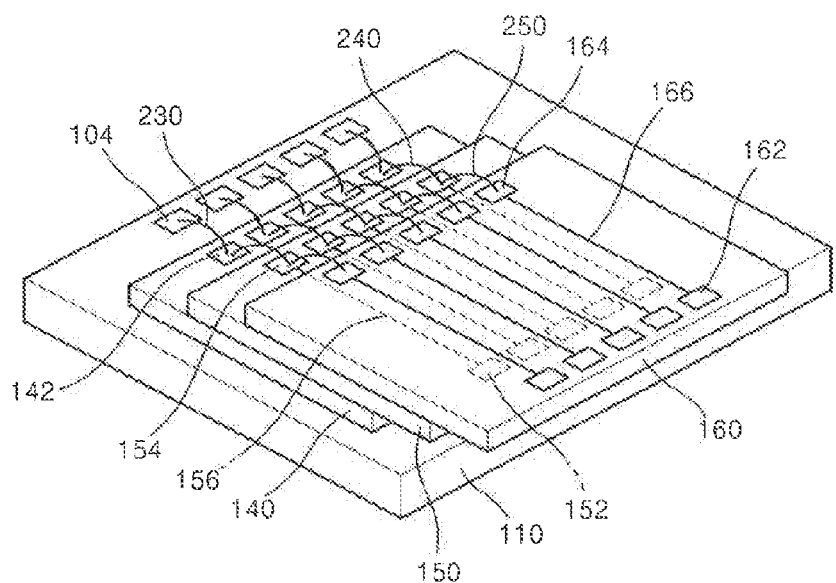

FIG. 5 is a perspective view illustrating a semiconductor package according to example embodiments. The semiconductor package according to example embodiments illustrated in FIG. 5 uses the semiconductor package illustrated in FIG. 4, and thus a repetitive description thereof will be omitted.

Referring to FIG. 5, a sixth semiconductor chip 160 may be further stacked on the fifth semiconductor chip 150. The sixth semiconductor chip 160 may include sixth electrode pads 162 and fourth redistribution pads 164. The fourth redistribution pads 164 may be disposed adjacent to the third redistribution pads 154 of the fifth semiconductor chip 150 and may be connected with sixth electrode pads 162 through the fourth redistribution lines 166.

The sixth semiconductor chip 160 may be offset in a direction inward from an edge of the fifth semiconductor chip 150 where the third redistribution pads 154 are disposed, such that the third redistribution pads 154 are exposed. Consequently, the fifth electrode pads 152 of the fifth semiconductor chip 150 may not be exposed because of being covered with the sixth semiconductor chip 160. In example embodiments, one or more semiconductor chips may be further stacked on the sixth semiconductor chip 160. Sixth bonding wires 250 may connect the fifth electrode pads 152 with the fourth redistribution pads 164.

Figure 6:
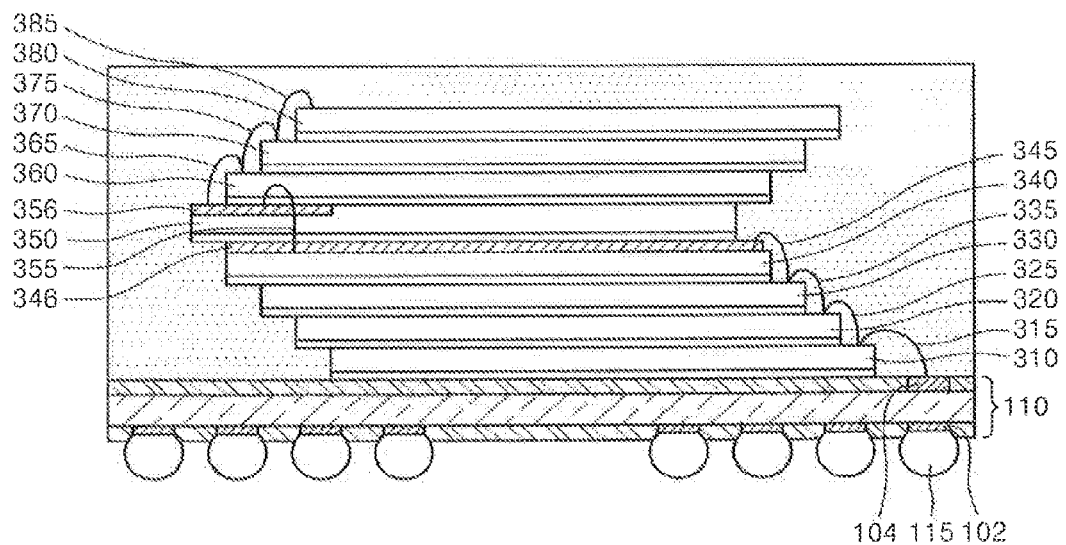
FIGS. 6-7 are cross-sectional views illustrating semiconductor packages according to example embodiments.

FIG. 6 is a cross-sectional view illustrating a semiconductor package according to example embodiments. Referring to FIG. 6, a plurality of semiconductor chips 310, 320, 330, 340, 350, 360, 370, and 380 may be stacked on the substrate 110. The substrate 110 may refer to the description made with reference to FIG. 1. The semiconductor chips 310, 320, 330, and 340 may be stacked in offset directions from one another. At least one bonding wire 315 may connect the semiconductor chip 130 with the substrate 110, at least one bonding wire 325 may connect the semiconductor chips 310 and 320 with each other, at least one bonding wire 335 may connect the semiconductor chips 320 and 330 with each other, and at least one bonding wire 345 may connect the semiconductor chips 330 and 340 with each other. For example, a deposition structure of the semiconductor chips 310, 320, 330, and 340 may be similar to that of the semiconductor package illustrated in FIG. 5.

The semiconductor chips 350, 360, 370, and 380 may be stacked offset at least in a direction opposite to the semiconductor chips 310, 320, 330, and 340. At least one bonding wire 365 may connect the semiconductor chips 350 and 360 with each other, at least one bonding wire 375 may connect the semiconductor chips 360 and 370 with each other, and at least one bonding wire 385 may connect the semiconductor chips 370 and 380 with each other. The bonding wires 365, 375, and 385 may be disposed in an opposite side to the boding wires 315, 325, 335, and 345 with respect to the semiconductor chips 310, 320, 330, 340, 350, 360, 370, and 380.

The semiconductor chip 340 may include at least one redistribution line 346, and the semiconductor chip 350 may include at least one redistribution line 356. The redistribution lines 346 and 356 may be connected with each other through at least one bonding wire 355. The redistribution line 346 may be stretched to connect the bonding wires 345 and 355 with each other. Consequently, the semiconductor chips 310, 320, 330, 340, 350, 360, 370, and 380 may be electrically connected with the substrate 110.

The semiconductor chips 310, 320, 330, 340, 350, 360, 370, and 380 may communicate a signal with an external device through external terminals 115 disposed on a rear surface of the substrate 110. For example, the external terminals 115 may be solder bumps or solder balls and may be attached on the bonding pads 102 disposed on the rear surface of the substrate 110.

According to example embodiments, connections of the semiconductor chips 310, 320, 330, 340, 350, 360, 370, and 380 may be simplified by stacking in offset directions from one another and the redistribution lines 346 and 356. In other words, the lengths of the connections of the bonding wires 315, 325, 335, 345, 355, 365, 375, and 385 may be reduced and arrangements of the connections may be simplified.

Figure 7:
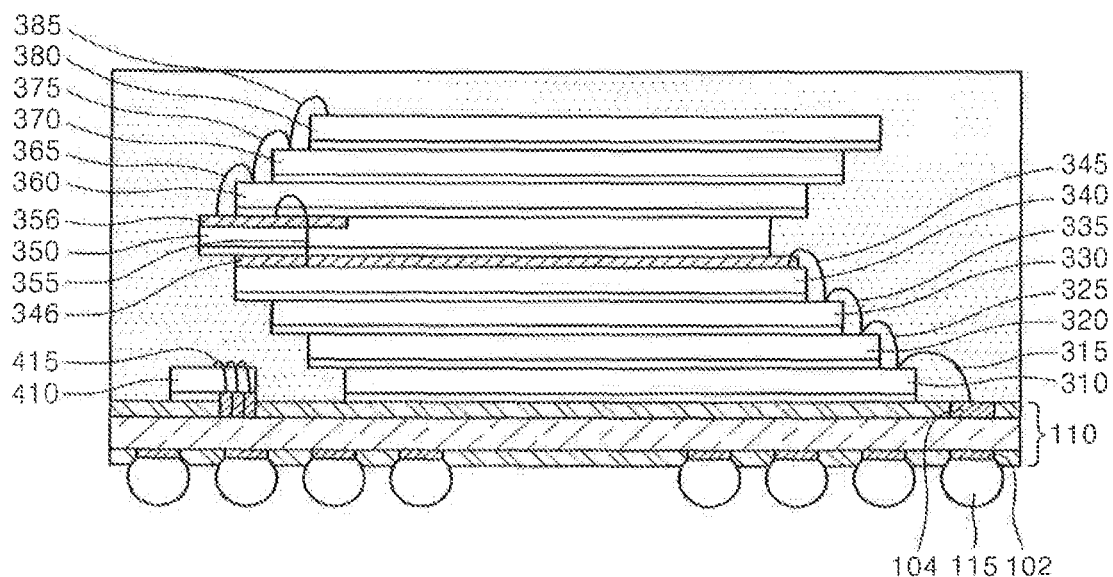

FIG. 7 is a cross-sectional view illustrating a semiconductor package according to example embodiments. The semiconductor package according to example embodiments illustrated in FIG. 7 may use the semiconductor package illustrated in FIG. 6, and thus a repetitive description thereof will be omitted. Referring to FIG. 7, a plurality of semiconductor chips 310, 320, 330, 340, 350, 360, 370, and 380 may be stacked on a first portion of the substrate 110 and a second semiconductor chip 410 may be stacked on a second portion of the substrate 110 which is different from the first portion. The second semiconductor chip 410 may be connected with the substrate 110 through a bonding wire 415. The substrate 110 may include a circuit pattern (not shown) for electrically connecting the semiconductor chips 310, 320, 330, 340, 350, 360, 370, and 380 with the second semiconductor chip 410.

For example, the semiconductor chips 310, 320, 330, 340, 350, 360, 370, and 380 may be memory devices, and the second semiconductor chip 410 may be a logic, chip for controlling the memory devices. The memory chip may include various types of memories, e.g., a dynamic random access memory (DRAM), a static random access memory (SRAM), a flash memory, a phase change random access memory (PRAM), a resistive random access memory (ReRAM), ferroelectric random access memory (FeRAM), or a magnetoresistive random access memory (MRAM). Such a semiconductor package may be used as an embedded memory card. In example embodiments, the second semiconductor chip 410 may be a controller for controlling the semiconductor chips 310, 320, 330, 340, 350, 360, 370, and 380. Because the embedded memory card, unlike an external memory card, does not require a slot, the embedded memory card may be used in small-size mobile devices. The embedded memory card also has flexibility in terms of product design, thus being a customer-friendly solution.

Figure 8:
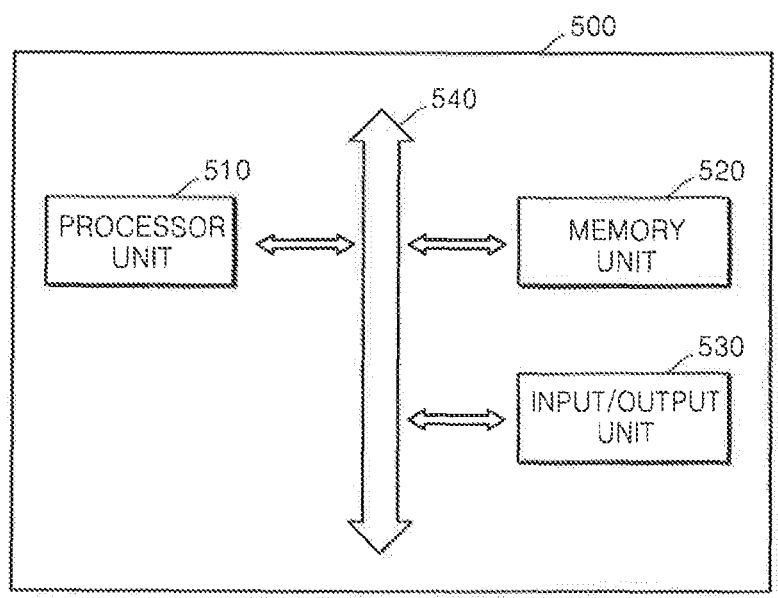
FIG. 8 is a block diagram illustrating an electronic system according to example embodiments.

FIG. 8 is a block diagram illustrating an electronic system 500 according to example embodiments Referring to FIG. 8, the electronic system 500 may include a processor unit 510, an input/output unit 530, and a memory unit 520, and they can communicate data therebetween by using a bus 540. The processor unit 510 may serve to execute a program and control the electronic system 500. The input/output unit 530 may be used to input and output data to and from the electronic system 500. By using the input/output unit 530, the electronic system 500 may be connected to an external device, e.g., a personal computer or a network, and communicate data with the external device. The memory unit 520 may store codes and data for operations of the processor unit 510. For example, the memory unit 520 may include at least one of the semiconductor packages illustrated in FIGS. 1 through 7.

For example, the electronic system 500 may constitute various electronic control devices which require the memory unit 520, and may be used for mobile phones, MP3 players, navigations, solid state disks (SSDs), or household appliances.

The foregoing description of example embodiments has been provided for the purposes of illustration and description. Accordingly, the inventive concept is not limited to example embodiments and it will be obvious that various modifications and variations, such as implementation of combinations of example embodiments, can be made by those of ordinary skill in the art.

What is claimed is:
1. A semiconductor device comprising:
a first plurality of chips stacked offset each other on a substrate, the plurality of chips comprising:
a first chip comprising a plurality of first pads and a plurality of second pads respectively disposed on first and second sides, the first and second sides being adjacent to each other, the first pads and the second pads connected by respective redistribution lines, and a second chip and a third chip stacked offset each other and electrically connected to each other by direct wire bonding, wherein the first chip is disposed on the second chip mad at least one of the second chip and the third chip is electrically connected to the first chip; and
a second plurality of chips electrically connected to at least one of the first plurality of chips, the second plurality of chips stacked offset each other on the first plurality of chips, wherein at least one of the second plurality of chips protrudes in a first direction between the least and the most protruded chips of the first plurality of chips in the first direction when viewed from above the second plurality of chips toward the substrate.
2. The device of claim 1, wherein a plurality of electrode pads are disposed on a first side of the second chip and on a first side of the third chip, and the connection by wire bonding is between at least one of the electrode pads of the second chip and at least one of the electrode pads of the third chip, the first sides of the second chip and the third chip being proximal to each other.

3. The device of claim 2, wherein the second and third chips are configured to receive first signals via the plurality of electrode pads on their first sides and the first chip is configured to output second signals via pads disposed on a side opposite the first sides of the second chip and the third chip.

4. The device of claim 1, wherein the first plurality of chips comprises at least four chips.

5. The device of claim 1, wherein at least one of the second or third chips includes a memory unit.

6. The device of claim 5, further including a fourth chip disposed on the substrate apart from the stacked first, second and third chips, the fourth chip connected to one of the stacked chips via a circuit pattern disposed on the substrate.

7. The device of claim 6, wherein the fourth chip includes logic configured to control the memory unit.

8. The device of claim 6, wherein the fourth chip includes a memory controller.

9. The device of claim 5, wherein the memory unit comprises at least one of DRAM, SRAM, FRAM, FeRAM, MRAM or nonvolatile flash memory.

10. The device of claim 9, further including a card packaging the memory unit as an embedded memory card.

11. A semiconductor device comprising:
a first plurality of chips comprising: a first chip comprising a plurality of first pads and a plurality of second pads respectively disposed on first and second sides, the first pads and the second pads connected by respective redistribution lines;
a second chip having second electrode pads disposed on a side; and
a third chip having third electrode pads disposed on a side, the second chip and the third chip being stacked to partially overlap each other without overlapping the second electrode pads or third electrode pads, wherein the second and third chips are electrically connected by direct wire bonding; and
a second plurality of chips electrically connected to at least one of the first plurality of chips,
wherein at least one of the second plurality of chips protrudes in a first direction between the least and the most protruded chips of the first plurality of chips in the first direction when viewed from above the second plurality of chips toward the substrate, and
the first plurality of chips are stacked offset on the second plurality of chips.

12. The device of claim 11, wherein the first pads and second pads of the first chip are respectively disposed on two sides adjacent to each other.

13. The device of claim 11, wherein at least two chips overlap the same footprint on the substrate when viewed from above the at least two chips downwardly toward the substrate.

14. The device of claim 13, wherein at least two other chips overlap another footprint of the same size on the substrate when viewed from above the chips downwardly toward the substrate.

15. The device of claim 11, wherein a plurality of electrode pads are disposed on a first side of the second chip and on a first side of the third chip, and the connection by wire bonding is between at least one of the electrode pads of the second chip and at least one of the electrode pads of the third chip, the first sides of the second chip and the third chip being proximal to each other.

16. The device of claim 15, wherein the second and third chips are configured to receive first signals via the plurality of electrode pads on their first sides and the first chip is configured to output second signals via pads disposed on a side opposite the first sides of the second chip and the third chip.

17. The device of claim 15, wherein the first signals flow through circuits in at least one of the second and third chips and the second signals are output from the circuits.

18. The device of claim 11, wherein at least one of the second or third chips includes a memory unit.

19. The device of claim 11, further including a fourth chip disposed on the substrate apart from the stacked first, second and third chips, the fourth chip connected to one of the stacked chips via a circuit pattern disposed on the substrate.

20. A semiconductor device comprising:
a substrate;
a first chip comprising a plurality of first pads and a plurality of second pads respectively disposed on first and second sides, the first pads and the second pads connected by respective redistribution lines;
a second chip having second electrode pads disposed on a side;
a third chip having third electrode pads disposed on a side;
a fourth chip having fourth electrode pads disposed on a side; and
a fifth chip having fifth electrode pads, the fifth chip stacked above the second chip, the third chip, and the fourth chip and overlapping the electrode pads of the second, third, and fourth chips connected by the wire bonding,
wherein when viewed from above the fifth chip downwardly toward the substrate, an outer edge of the fifth chip is positioned between the outer edges of the second, third, and fourth chips,
the second chip, the third chip, and the fourth chip are positioned one on top of the other with the side having the second electrode pads and the third electrode pads exposed, and
at least one second electrode pad is connected to corresponding at least one third electrode pad, and at least one third electrode pad is connected to corresponding at least one fourth electrode pad by direct wire bonding.

* * * * *